us005699315A

United States Patent [19]

Ko

[11] Patent Number: 5,699,315
[45] Date of Patent: Dec. 16, 1997

[54] DATA PROCESSING WITH ENERGY-EFFICIENT, MULTI-DIVIDED MODULE MEMORY ARCHITECTURES

[75] Inventor: Uming Ko, Plano, Tex.

[73] Assignee: Texas Instruments Incorporated, Dallas, Tex.

[21] Appl. No.: 739,239

[22] Filed: Oct. 29, 1996

Related U.S. Application Data

[63] Continuation of Ser. No. 409,578, Mar. 24, 1995, abandoned.

[51] Int. Cl.$^6$ .................................................. G11C 7/00
[52] U.S. Cl. .......................... 365/230.03; 365/230.01; 365/230.02
[58] Field of Search ................... 365/220.03, 230.02, 365/230.01

[56] References Cited

U.S. PATENT DOCUMENTS

| | | | |
|---|---|---|---|
| 5,237,536 | 8/1993 | Ohtsuki | 365/230.06 |
| 5,237,674 | 8/1993 | Mohme et al. | 365/230.03 |
| 5,241,510 | 8/1993 | Kobayashi et al. | 365/230.03 |
| 5,274,788 | 12/1993 | Koike | 365/230.03 |
| 5,301,162 | 4/1994 | Shimizu | 365/230.03 |
| 5,319,602 | 6/1994 | Shishikura | 365/230.03 |
| 5,430,686 | 7/1995 | Tokami et al. | 365/230.01 |
| 5,450,366 | 9/1995 | Watanabe | 365/230.01 |
| 5,473,573 | 12/1995 | Rao | 365/230.01 |

*Primary Examiner*—David C. Nelms
*Assistant Examiner*—Vu A. Le
*Attorney, Agent, or Firm*—Scott B. Stahl; W. James Brady; Richard L. Donaldson

[57] ABSTRACT

A memory architecture (11,12) includes an address bus and a plurality of address decoders (15). Each address decoder has an input which is selectively connectable to and disconnectable from the address bus.

16 Claims, 4 Drawing Sheets

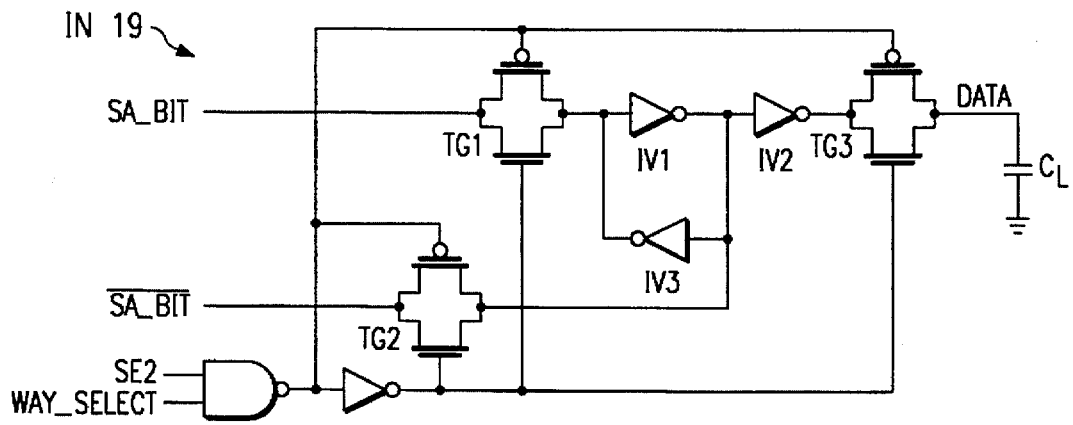
FIG. 5
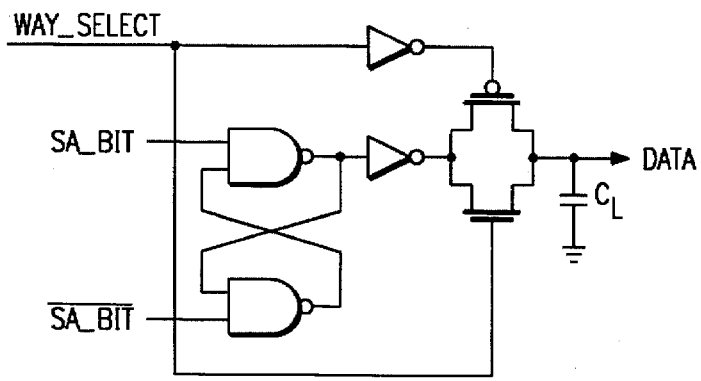
FIG. 6
(PRIOR ART)
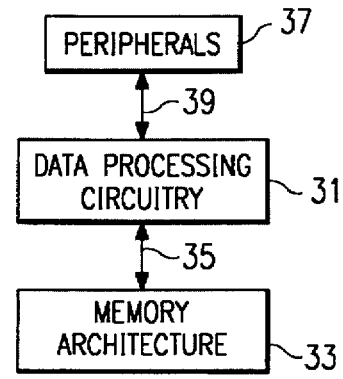
FIG. 7
POWER PERCENTAGE OF A MEMORY FUNCTION
| MEMORY SUBSYSTEM | BIT ARRAY | PERIPHERAL: SENSE AMP AND RD/WR | PERIPHERAL: CONTROL GENERATION | PERIPHERAL: ADDRESS DECODE |
|---|---|---|---|---|
| 8 KBITS | 35.1% | 15.0% | 30.5% | 18.5% |
| 32 KBITS | 44.4% | 14.5% | 25.0% | 13.0% |
| 128 KBITS | 57.9% | 13.0% | 19.0% | 9.5% |
FIG. 8

DATA PROCESSING WITH ENERGY-EFFICIENT, MULTI-DIVIDED MODULE MEMORY ARCHITECTURES

This application is a Continuation of application Ser. No. 08/409,578, filed Mar. 24, 1995 now abandoned.

FIELD OF THE INVENTION

The invention relates generally to data processing and, more particularly, to energy efficient memory architectures for data processing applications.

BACKGROUND OF THE INVENTION

As microprocessor frequencies increase with shrinking process technologies and superpipelining architectures, the speed disparity between the microprocessor and external memory increases. Hence, to boost a computer system's performance, there is a tendency to use larger and larger on-chip caches to reduce the external memory accesses. Apart from performance advantage, on-chip caches can also reduce the overall power consumption of a processor. The power dissipation of an external memory access is at least an order of magnitude higher than that of an on-chip access due to capacitance overhead of device I/O, board traces and discrete, larger memory components. For a processor with a larger on-chip cache, fewer accesses will need to go to the external memory, resulting in a lower power dissipation. However, a larger on-chip cache will increase the latency due to the increase in capacitance on bit-lines and word-lines and more logic depths to decode addresses.

One solution to this problem is to use a smaller low-level cache to absorb some memory accesses at a shorter latency and a larger, higher-level cache to complement the low-level cache. Since a larger, higher level on-chip cache will be accessed less frequently, there will be power as well as performance benefits. This concept can be extended to have multiple levels of caches within a processor chip. However, die area will limit transistors available for total number of caches in the hierarchy and their associated controllers. In addition, if appropriate cache sizes are not used at each level, the performance and power gains may not be substantial, or even worse, the gains can be negative if such cache parameters are not chosen wisely.

Known techniques for low-power memory design include an appropriate use of lower threshold-voltage MOSFETs in sense amplifiers to improve speed at low voltage, memory array partitioning so only desired bit-lines move, limiting swing of local wordlines instead of clamping them, and half-$V_{dd}$ precharge with partial activation of multi-divided array for lower power. These memory bit array partitioning or dividing techniques reduce bit array power dissipation due to large capacitance on bit-lines and word-lines.

The present invention includes a more detailed power characterization of some memory functions which indicates that power dissipation of memory peripheral circuitry also needs to be considered in order to minimize overall power of the memory subsystem. Such peripheral circuitry includes the address decoder, control generation circuitry, sense amplifiers, and read/write mux/buffers. The invention recognizes that, in some non-divided memory designs, power consumed in the memory peripheral circuitry is greater than that consumed in the bit array if the memory has less than 128K bits (see FIG. 8). Therefore, the present invention provides a technique to improve energy efficiency by partitioning the entire memory into independently selectable modules, for example, a low-power, high-performance cache architecture that includes energy-efficient, independently selectable memory modules. The invention also provides energy-efficient word line decoders, sense amplifiers, and push-pull latch/buffers.

BRIEF DESCRIPTION OF THE DRAWINGS

FIG. 5 illustrates an exemplary embodiment of a low-power, self-timed push/pull output latch/buffer according to the invention.

FIG. 6 illustrates a conventional latching circuit for receiving the output of a sense amplifier of a memory circuit.

FIG. 7 illustrates an exemplary embodiment of a data processing system according to the invention.

FIG. 8 illustrates the relative power consumption of various portions of a non-divided memory function.

DETAILED DESCRIPTION

Figure 1:
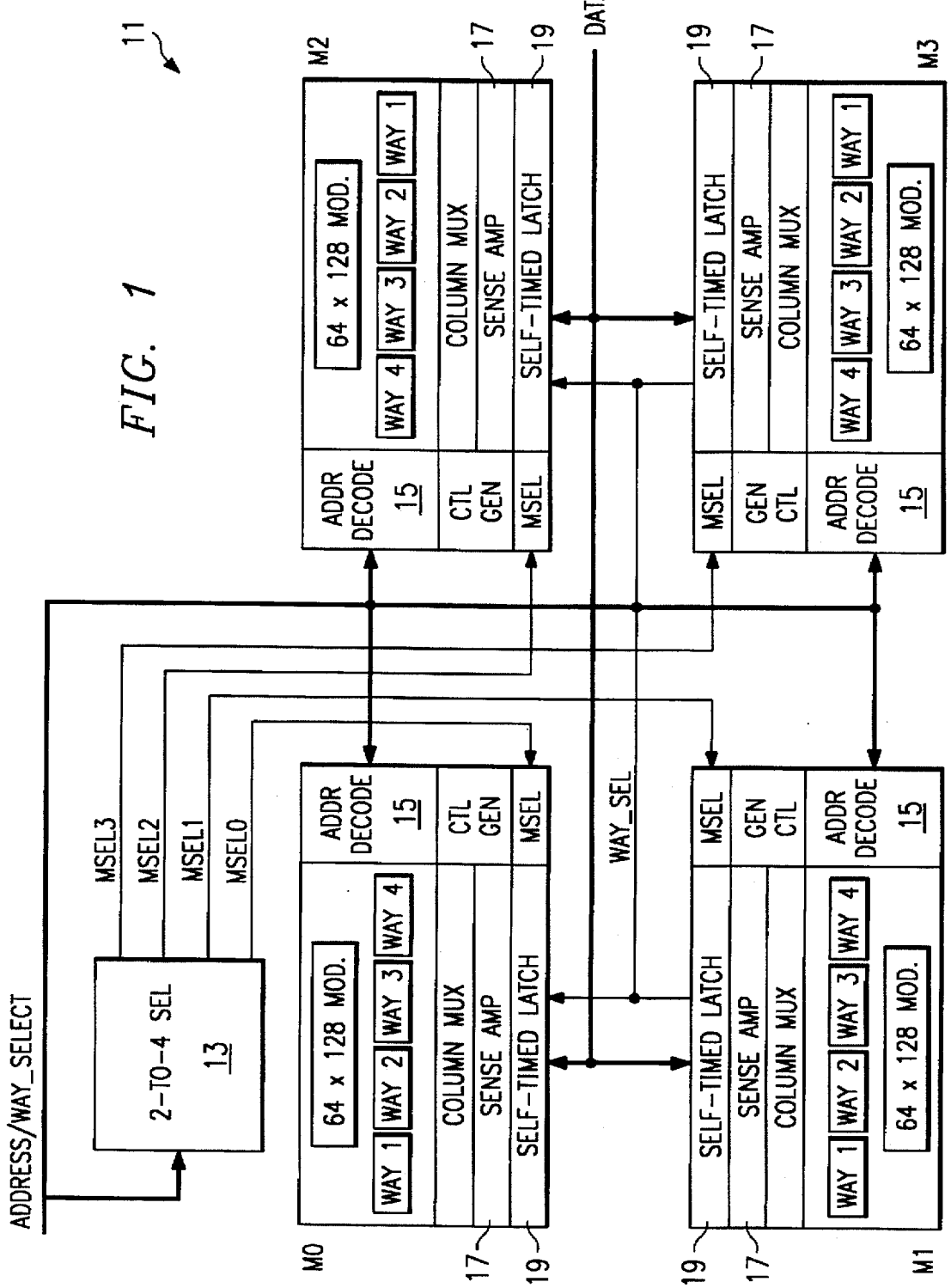
FIG. 1 illustrates an exemplary embodiment of a multi-divided memory architecture according to the invention.

FIG. 1 illustrates an exemplary multi-divided module (MDM) cache architecture 11 including M (in this example M=4) identical, independently selectable memory modules (M0-M3) with 1K bytes each, each module also having peripheral circuitry including address decoder 15, column multiplexers, sense amplifiers 17, self-timed data output latches 19, and control generation circuitry for controlling timing among the address decoders, column multiplexers and sense amplifiers. Two higher order, incoming address bits are decoded at selector 13 into four module select signals (msel$_{0-3}$ in FIG. 1). Each msel$_m$ signal determines if the capacitance of the associated module address decoder should be exposed to the global address, and if the associated sense amplifiers should be activated. Since only one module is activated at a time, load capacitance is reduced by a factor of M which effectively makes each module consume 1/M power of an equivalent non-divided memory (including both bit-array and peripheral circuitry). The multi-divided module (MDM) cache architecture of FIG. 1 provides an array of smaller memory modules with less capacitance on bit array as well as peripheral circuitry. Another benefit of this size-reconfigurable cache design is that it significantly reduces the design cycle time because the same module can be duplicated to allow for quick turnaround of a different cache size in trading-off energy efficiency.

Figure 2:
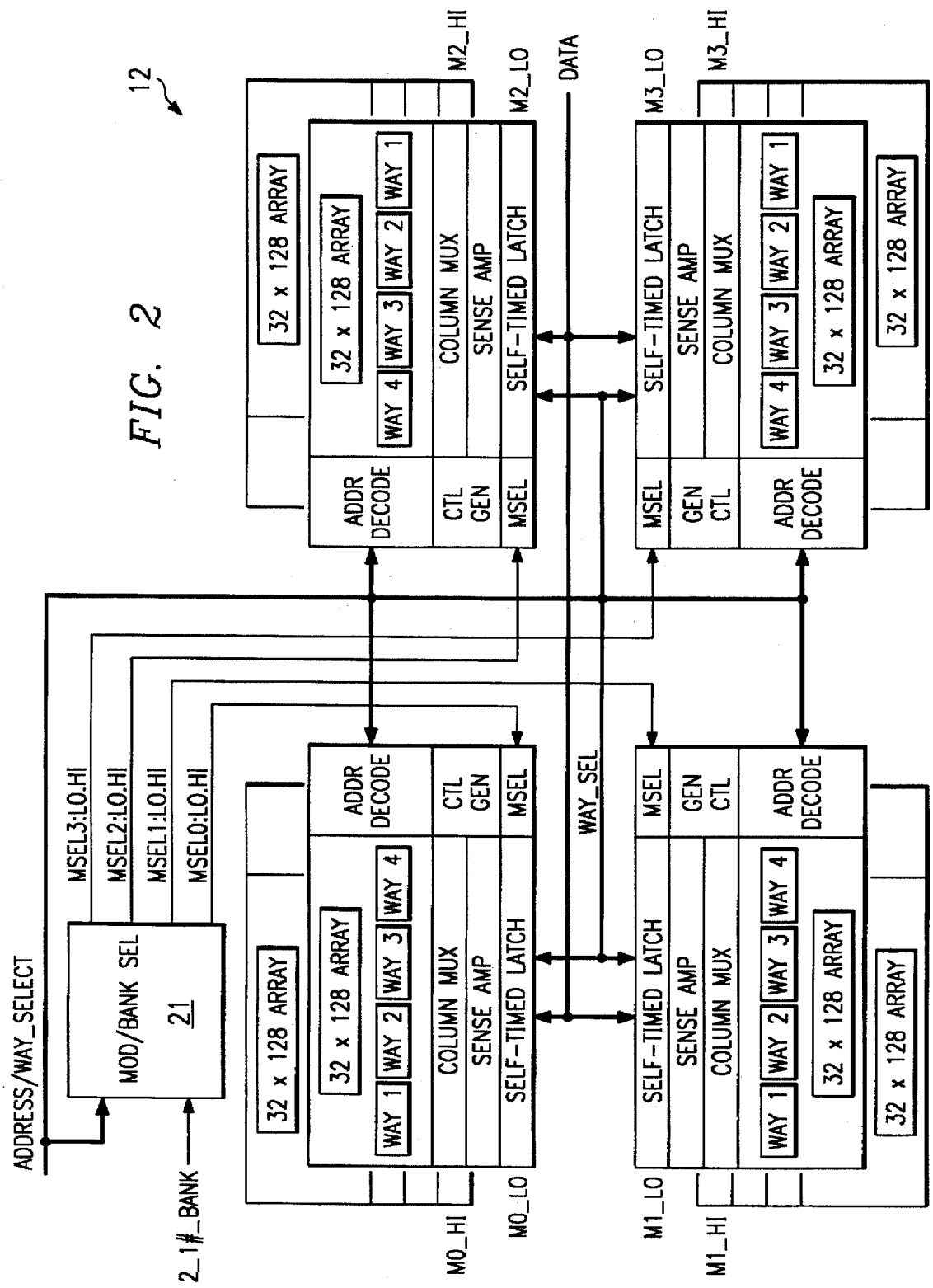
FIG. 2 illustrates another exemplary embodiment of a multi-divided memory architecture according to the invention.

In the exemplary embodiment 12 of FIG. 2, each module is further divided into a low-bank (Mx__lo) and a high-bank (Mx__hi) with 512 bytes each. Each of the eight illustrated banks has the same bit array and peripheral circuitry as the remaining seven banks. An input signal named 2__1#__bank is decoded at selector 21 to determine if one bank or both banks of the selected module should be activated. When 2__1#__bank indicates that only one bank of data is desired, either the high four-byte bank (e.g. M0__hi) or low four-byte bank (e.g. M0__lo) will be addressed by a third higher order address bit decoded at selector 21, so that effectively only one of the two banks consumes power. The signals msel$_{0-3}$:lo__hi, output from selector 21 of FIG. 2, include the following information: (1) whether the module is selected; (2) whether one or both banks is (are) selected; and (3) which bank is selected, if only one is selected.

The input signals way_select in FIGS. 1 and 2 further select which of the four way modules (way 1–way 4) should be gated to the data bus.

From the performance standpoint, the MDM example of FIG. 2 allows a 4-Kbyte cache to be accessed as fast as a 0.5-Kbyte cache module. From the power standpoint, it reduces the power by a factor of up to eight (4 modules×2 banks), when only one bank of data is required.

Figure 3:
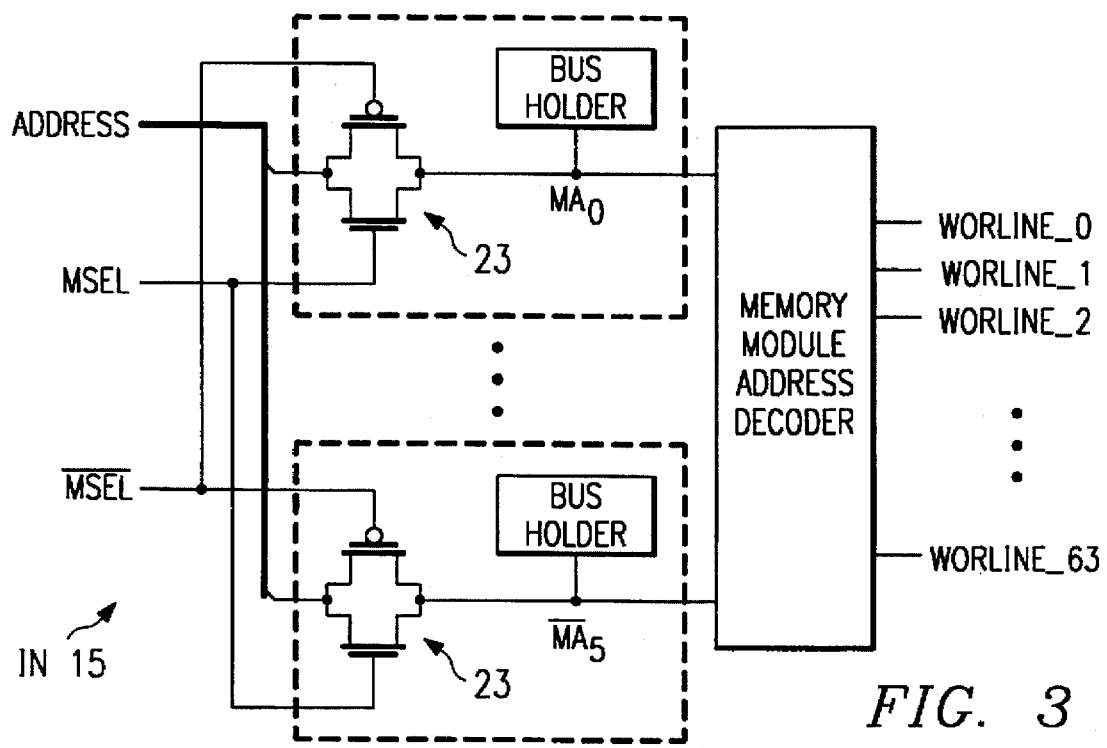
FIG. 3 illustrates an exemplary embodiment of a low-power, selectable address decode circuit according to the invention.

FIG. 3 depicts one example of how the load capacitance of an individual module address decoder can be isolated from the global address by transmission gates 23 when the memory module is not selected. A similar isolation approach can be applied to the control generation for the peripheral circuitry. The speed overhead cost of such isolation is only one gate delay. A bus-holder is added to each module address line ($ma_n$) to prevent any static power dissipation due to a tri-state condition when a bank/module is not selected. In the banked MDM of FIG. 2, the module select and bank select information in msel:lo_hi would control the gates 23 to isolate the address decoder of an unselected bank.

Figure 4:
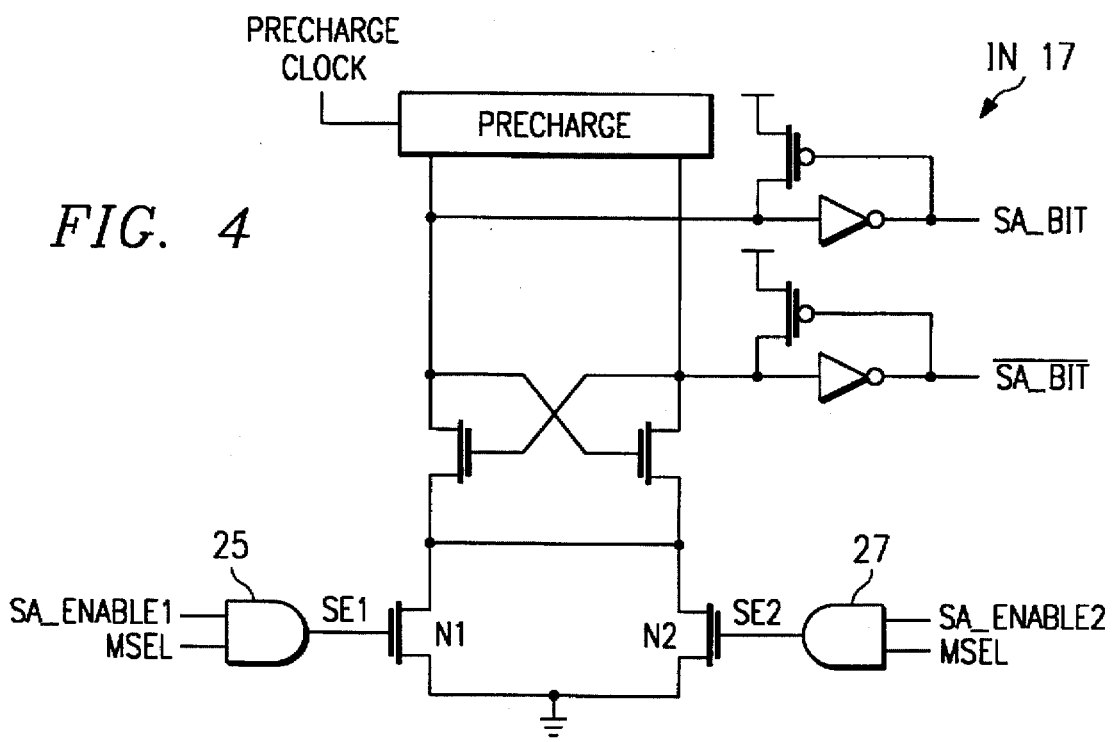
FIG. 4 illustrates an exemplary embodiment of a low-power, selectable sense amplifier according to the invention.

FIG. 4 illustrates one example of how the $msel_m$ control signals are applied to activate desired sense amplifiers. Conventional two-stroke sense amp enable signals sa_enable 1 and sa_enable 2 are utilized to improve latency, and are gated by the associated msel signal via AND gates 25 and 27. As is conventional, signal sa_enable1 arrives slightly earlier than signal sa_enable2, while the former is relatively weaker in drive strength than the latter. The designs of AND gates 25 and 27 are selected to preserve this time and drive strength relationship in the gated signals se1 and se2 output from NAND gates 25 and 27. In the banked MDM of FIG. 2, sa_enable1 and sa_enable 2 would be gated by the module select and bank select information in msel:lo_hi so that the sense amp of an unselected bank would not be activated.

One of the FIG. 4 enable signals (se2) is also used in the example of FIG. 5 to allow for the self-timed data output latching function 19 to be selectively turned on by the way select signals (way_select) to convert the dynamic outputs sa_bit and (sa_bit)' from FIG. 4 into a static logic level for the data bus. SPICE simulations indicate that this type of push-pull latch circuit, including inverters iv1, iv2, and iv3, and transmission gates tg1, tg2 and tg3 connected as shown, improves by 40% over the energy efficiency of the conventional cross-coupled-NAND latch shown in FIG. 6. The latch/buffer function of FIG. 5 also prevents unnecessary switching on the data bus when a bank is not desired, because se2 is low when the associated bank is not selected (as discussed above relative to FIG. 4), thus disabling tg3.

Overall power saving from the above-described selective control of memory peripheral circuits other than the bit array can range from 30% to 50% of a memory module. The smaller the cache size, the bigger the saving.

FIG. 7 illustrates a data processing system according to the invention. Data processing circuitry 31 communicates with memory architecture 33 via bus 35, and also communicates via bus 39 with other peripheral devices at 37, for example, host bus controller, system bus controller, graphics controller, power management controller, hard/floppy disk controller, serial/parallel 90 controller, DMA/Interrupt controllers, PCMCIA bus controller, multimedia interface, etc. The address, way_select and 2_1#_bank signals of FIGS. 1 and 2, along with other well known memory control signals, are provided to memory architecture 33 from data processing circuitry 31 via bus 35. The data processing circuitry 31 and memory architecture 33 may be provided together on a single microprocessor chip, or discretely. The memory architecture 33 may be as shown at 11 or 12 above.

Although exemplary embodiments of the present invention are described above, this description does not limit the scope of the invention, which can be practiced in a variety of embodiments.

What is claimed is:

1. A memory architecture, comprising:

an address bus;

a plurality of separate memory modules, each said memory module including an address decoder, each said address decoder having an input which is selectively connectable to and disconnectable from said address bus, each said memory module including a switch structure having a plurality of data inputs connected to said address bus and having a plurality of data outputs connected to said address decoder; and a plurality of bus holders respectively connected to said data outputs of said switch structures.

2. A memory structure, comprising:

a memory circuit which stores information at addressable locations therein;

an address bus for providing addresses for addressing said memory circuit;

an address decoder coupled between said address bus and said memory circuit, said address decoder including address inputs for receiving addresses from said address bus, and also including control outputs for applying control signals to said memory circuit in response to said addresses; and a plurality of bus holders respectively connected to said address inputs of said address decoder.

3. A data processing apparatus, comprising:

a memory structure including a memory circuit which stores information at addressable locations therein, an address bus for providing addresses for addressing said memory circuit, an address decoder coupled between said address bus and said memory circuit, said address decoder including address inputs for receiving addresses from said address bus, and said address decoder also including control outputs for applying control signals to said memory circuit in response to said addresses, and said memory structure including a plurality of bus holders respectively connected to said address inputs of said address decoder; and data processing circuitry coupled to said memory structure for performing data processing operations in response to information obtained from said memory structure.

4. The apparatus of claim 3, wherein said apparatus is provided as a single semiconductor integrated circuit.

5. The apparatus of claim 3, wherein said control outputs are wordlines.

6. The memory structure of claim 2, wherein said control outputs are wordlines.

7. A data processing apparatus, comprising:

a memory architecture including an address bus, a plurality of separate memory modules, each said memory module including an address decoder, each said address decoder having an input which is selectively connectable to and disconnectable from said address bus, each said memory module including a switch structure having a plurality of data inputs connected to said address bus and having a plurality of data outputs connected to said address decoder, and said memory architecture including a plurality of bus holden respectively connected to said data outputs of said switch structures; and data processing circuitry coupled to said memory architecture for performing data processing operations in response to information obtained from said memory architecture.

8. The apparatus of claim 7, including a peripheral apparatus coupled to said data processing circuitry for communication between said peripheral apparatus and said data processing circuitry.

9. The apparatus of claim 8, wherein said peripheral apparatus is a bus controller.

10. The apparatus of claim 8, wherein said peripheral apparatus is a hard disk controller.

11. The apparatus of claim 8, wherein said peripheral apparatus is a floppy disk controller.

12. The apparatus of claim 7, wherein said apparatus is provided as a single semiconductor integrated circuit.

13. A data processing system, comprising:

a memory structure including a memory circuit which stores information at addressable locations therein, an address bus for providing addresses for addressing said memory circuit, an address decoder coupled between said address bus and said memory circuit, said address decoder including address inputs for receiving addresses from said address bus, said address decoder also including control outputs for applying control signals to said memory circuit in response to said addresses, and said memory structure including a plurality of bus holders respectively connected to said address inputs of said address decoder;

data processing circuitry coupled to said memory structure for performing data processing operations in response to information obtained from said memory structure; and a peripheral apparatus coupled to said data processing circuitry for communication between said peripheral apparatus and said data processing circuitry.

14. The system of claim 13, wherein said peripheral apparatus is a bus controller.

15. The system of claim 13, wherein said peripheral apparatus is a hard disk controller.

16. The system of claim 13, wherein said peripheral apparatus is a floppy disk controller.

* * * * *